US006905950B2

(12) United States Patent
Subramanian et al.

(10) Patent No.: US 6,905,950 B2
(45) Date of Patent: Jun. 14, 2005

(54) GROWING COPPER VIAS OR LINES WITHIN A PATTERNED RESIST USING A COPPER SEED LAYER

(75) Inventors: Ramkumar Subramanian, San Jose, CA (US); Michael K. Templeton, Atherton, CA (US); Bhanwar Singh, Morgan Hill, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 612 days.

(21) Appl. No.: 09/893,198

(22) Filed: Jun. 27, 2001

(65) Prior Publication Data

US 2003/0003701 A1 Jan. 2, 2003

(51) Int. Cl.$^7$ .......................................... H01L 21/3205
(52) U.S. Cl. ...................... 438/586; 438/637; 438/643; 438/687
(58) Field of Search ............................... 438/586, 637, 438/643, 687

(56) References Cited

U.S. PATENT DOCUMENTS

| | | | |
|---|---|---|---|
| 5,112,448 A | 5/1992 | Chakravorty | |
| 5,316,974 A | 5/1994 | Crank | |
| 5,821,169 A | 10/1998 | Nguyyen et al. | 438/736 |
| 5,877,075 A | 3/1999 | Dai et al. | 438/597 |
| 5,877,076 A | 3/1999 | Dai | 438/597 |
| 6,077,733 A | 6/2000 | Chen et al. | 438/182 |
| 6,096,648 A | 8/2000 | Lopatin et al. | |
| 6,117,784 A | 9/2000 | Uzoh | |
| 6,143,126 A | 11/2000 | Stevens | |
| 6,207,546 B1 | 3/2001 | Chen et al. | 438/612 |
| 6,753,250 B1 * | 6/2004 | Hill et al. | 438/637 |

OTHER PUBLICATIONS

International Search Report mailed Feb. 19, 2003; Related to PCT/US02/03021 filed Jan. 31, 2002.

* cited by examiner

*Primary Examiner*—Hoai Ho
*Assistant Examiner*—Renee R. Berry
(74) *Attorney, Agent, or Firm*—Amin & Turocy, LLP

(57) ABSTRACT

The present invention involves a method for fabricating interconnecting lines and vias. According to the invention, copper is grown within the openings in a patterned coating. The patterned coating can be a resist coating or a dielectric coating. Either type of coating can be formed over a copper seed layer, whereby the seed layer is exposed within the pattern gaps. The copper seed layer can also be provided within the pattern gaps after patterning. Copper features are grown within the pattern gaps by plating. Where the patterned coating is a resist, the resist is stripped leaving the copper features in the inverse pattern image. The copper features can be coated with a diffusion barrier layer and a dielectric. The dielectric is polished to leave the dielectric filling the spaces between copper features. The invention provides copper lines and vias without the need for a dielectric or metal etching step. Another benefit of the invention is that lines widths can be increased by trimming the patterned coating prior to growing the copper features.

25 Claims, 6 Drawing Sheets

GROWING COPPER VIAS OR LINES WITHIN A PATTERNED RESIST USING A COPPER SEED LAYER

TECHNICAL FIELD

The present invention generally relates to the fabrication of integrated circuit devices. In particular, the present invention relates to a method for fabricating interconnecting conductive lines and vias.

BACKGROUND

In the semiconductor industry, there is a continuing trend toward higher device densities. To achieve these high densities there have been, and continue to be, efforts toward scaling down (e.g., to submicron levels) device dimensions on semiconductor wafers. In order to accomplish such high device packing density, smaller and smaller features sizes are required. These features sizes include the width and spacing of interconnecting lines, and the spacing and diameter of metal contact vias.

High resolution lithographic processes are employed to define patterns for interconnecting lines and vias. In general, lithography refers to processes for pattern transfer between various media. It is a technique used for integrated circuit fabrication in which a silicon slice, the wafer, is coated uniformly with a radiation-sensitive film, the resist. The film is exposed with a radiation source (such as optical light, x-rays, or an electron beam) that irradiates selected areas of the surface through an intervening master template, the mask, forming a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through the mask causes the image area to become either more or less soluble (depending on the coating) in a particular solvent developer. The more soluble areas are removed in the developing process leaving the less soluble photoresist forming a patterned coating.

A typical method of employing lithography to form metal lines and vias is to form the patterned resist coating over a dielectric layer, such as a layer of silicon oxide. An anisotropic etching process can then be employed to remove the dielectric where it is left exposed by the resist coating. Thereby, the resist pattern is transfer to the dielectric layer. The photoresist is then stripped. A blanket coating of metal is applied over the dielectric layer, filling the gaps in the dielectric pattern. The metal layer is then polished or etched until only the portion metal within the pattern gaps remains. Additional steps may be taken to form multilevel interconnections.

While the existing technology for forming metal lines and vias is workable, there remains room for improvement. The existing technology involves a dielectric etch and clean that is difficult to engineer; the process contributes significantly to the overall cost of integrated circuit devices; and the dimension of the resulting lines and vias limits the state of the art for integrated circuit devices. Thus, there remains an unmet need for improved processes for forming metal lines and vias.

SUMMARY OF THE INVENTION

The following presents a simplified summary of the invention in order to provide a basic understanding of some of its aspects. This summary is not an extensive overview of the invention and is intended neither to identify key or critical elements of the invention nor to delineate its scope. The primary purpose of this summary is to present some concepts of the invention in a simplified form as a prelude to the more detailed description that is presented later.

The present invention involves a method for fabricating interconnecting lines and vias. In a method of the invention, copper is grown within openings in a patterned coating. The patterned coating can be a resist or a dielectric. According to one aspect of the invention, a resist is patterned over a copper seed layer, exposing the copper seed layer in the pattern gaps. Alternatively, a copper seed layer is formed in the pattern gaps after patterning. Copper is grown within the pattern gaps by plating from the seed layer. The resist is stripped leaving the copper features in the inverse pattern image. The copper features can be coated with a diffusion barrier layer and a dielectric. The dielectric is polished to leave the dielectric filling the spaces between copper features.

According to another aspect of the invention, a resist is patterned over a copper seed layer and a dielectric coating is formed over the patterned resist. Polishing leaves the dielectric in the inverse pattern image. The resist is stripped, whereby the copper seed layer is exposed in the inverse pattern gaps. Alternatively, a copper seed layer is formed in the gaps after patterning. Copper is grown within the gaps by plating from the seed layer. Polishing can be employed to planarize the copper features and the dielectric.

The invention provides copper lines and vias without the need for a dielectric or metal etching step. Another benefit of the invention is that lines widths can be increased by trimming the patterned coating prior to growing the copper features. Other advantages and novel features of the invention will become apparent from the following detailed description of the invention and the accompanying drawings. The detailed description and drawings provide certain illustrative examples of the invention. These examples are indicative of but a few of the various ways in which the principles of the invention can be employed.

DISCLOSURE OF THE INVENTION

Figure 1:
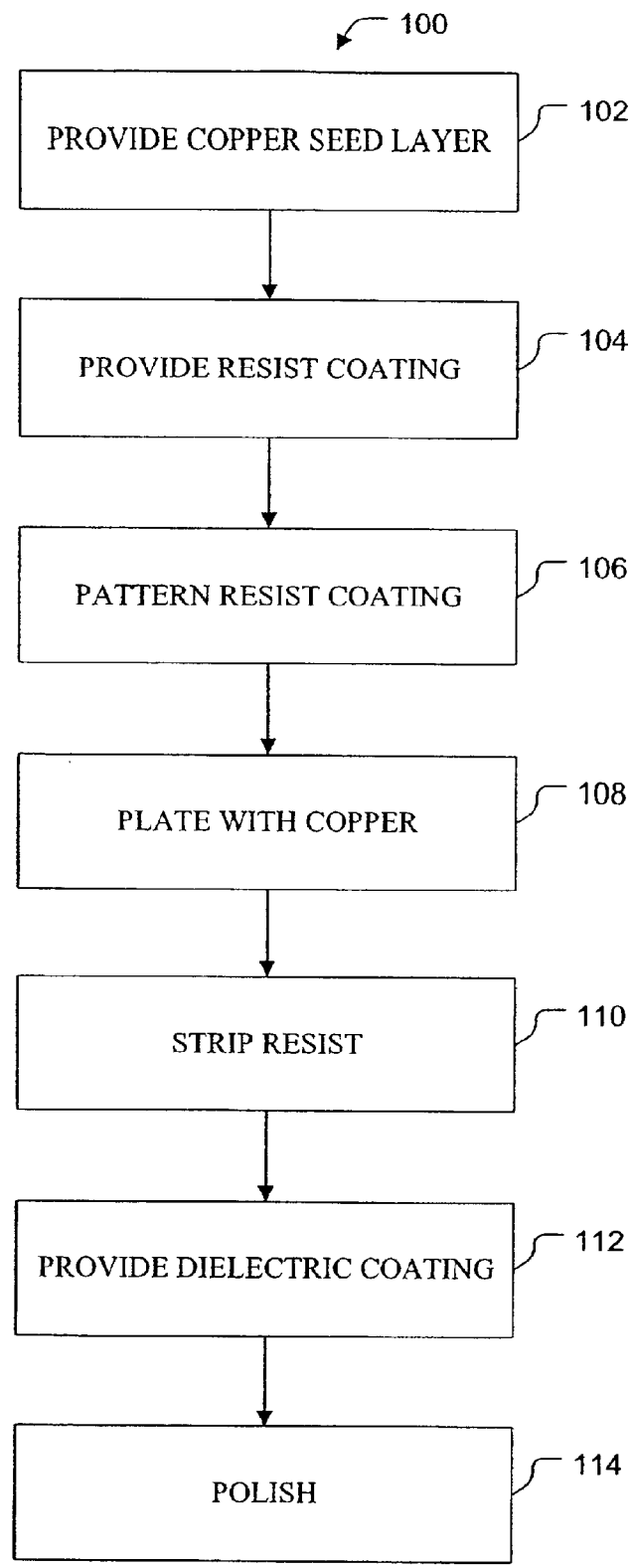
FIG. 1 is a flow chart of a process for forming copper features according to one aspect of the present invention.

FIG. 1 is a flow chart for a process 100 for forming copper features on a semiconductor substrate according to one aspect of the present invention. In process 100, a copper seed layer is formed over the semiconductor substrate. A patterned resist is formed over the copper seed layer, whereby the copper seed is only exposed within gaps or openings in the patterned resist. Copper is grown within the pattern openings by plating. The resist is stripped and the copper features are coated with a dielectric. Polishing planarizes the surface and exposes the copper features. The process provides the copper features according to the pattern of the resist, with the spaces between features filled with dielectric, all without the need for a dielectric etching step.

The semiconductor substrate includes a semiconductor, typically silicon. Other examples of semiconductors include GaAs and InP. In addition to a semiconducting material, the semiconductor substrate may include various elements and/or layers; including metal layers, barrier layers, dielectric layers, device structures, active elements and passive elements including silicon gates, word lines, source regions, drain regions, bit lines, bases emitters, collectors, conductive lines, conductive via, etc.

Process 100, begins with act 102, which is depositing a copper seed layer over the semiconductor substrate. The copper seed layer contains copper. The copper can be unalloyed or can be in the form of an alloy with one or more suitable alloying elements, such as Mg, Al, Zn, Zr, Sn, Ni, Pd, Ag, or Au. The seed layer can be deposited by any suitable means, including, for example, sputter deposition or CVD deposition. The thickness and coverage of the copper seed layer depends on the plating process to be employed. For electroplating, the seed layer is generally continuous. For electroless plating, a seed layer less than about 100 Å can be sufficient, and the layer can be composed of islets of metal.

Act 104 is coating the semiconductor substrate and the copper seed layer with a resist. The resist material may be organic or inorganic. The resist may be a photoresist responsive to visible light, ultraviolet light, or x-rays, or the resist may be an electron beam resist or an ion beam resist. A positive or negative tone resist can be used. Examples of resists include novalacs, poly-t-butoxycarbonyloxystyrenes (PBOCOS), poly-methylmethacrylates (PMMA), poly (olephin sulfones) (POS), and poly(methyl isophenyl ketones) (PMIPK). The resist may be chemically amplified. Resists are commercially available from a number of sources, including Shipley Company, Kodak, Hoechst Celanese Corporation, Clariant, JSR Microelectronics, Hunt, Arch Chemical, Aquamer, and Brewer.

The resist may be coated by any suitable means. Spin coating, dip coating, or vapor deposition may be used, depending on the coating material. For example, a 157 nm sensitive photoresist, a 193 nm sensitive photoresist, an I-line, H-line, G-line, E-line, mid UV, deep UV, or extreme UV photoresist may be spin-coated on the semiconductor substrate surface.

In one embodiment, the resist coating is from about 200 Å to about 20,000 Å thick. In another embodiment, the resist coating is from about 500 Å to about 10,000 Å thick. The thickness depends on the desired copper feature size. Depending on the application suitable thicknesses make be in the range from about 1,800 Å to about 4,000 Å; from about 4,500 Å to about 6,000 Å; from about 6,500 Å to about 8,000 Å; or from about 8,500 Å to about 10,000 Å, for example.

Figure 2:
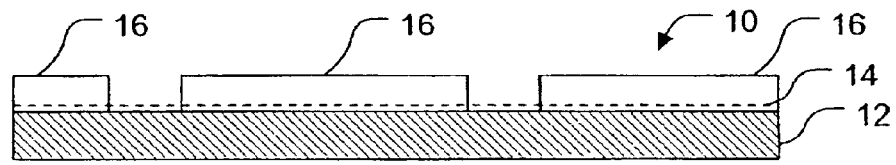
FIG. 2 illustrates a patterned resist over a copper seed layer over a semiconductor substrate.

Act 106 is patterning the resist coating. This involves exposing the resist to actinic radiation through a patterned mask or reticle and developing the resist with a suitable solvent developer. FIG. 2 illustrates a device 10 having the resulting structure. Device 10 includes substrate 12, copper seed layer 14, and patterned resist coating 16.

In addition to conventional patterning, the resist can be trimmed. The density of lines is generally limited by the lithographic process. At the limit or resolution, the spacing between lines is approximately equal to the width of the lines. Trimming can increase the widths of the lines by reducing the spacing between lines. Thus, trimming increases line widths and line conductivities while maintaining the maximum line density enabled by a lithographic process.

Trimming is generally carried out by etching. Etching can involve a physical process, a chemical process, or a combined physical and chemical process. Physical processes can include glow-discharge sputtering or ion beam milling. Physical processes are comparatively non-selective as to the type of material removed. Combined physical and chemical process include reactive ion etching (RIE) and plasma etching. Examples of gases that may be used in reactive ion or plasma etching include oxygen, fluorine compounds, such as carbon tetrafluoride, chlorine compounds, such as $Cl_2$, hydrogen, inert gases, and combinations of the foregoing. Chemical processes include wet etching. For example, an acid, a base, or a solvent can be employed, depending on the nature of the resist coating. Acids that may be used include hydrofluoric acid, hydrobromic acid, nitric acid, phosphoric acid or acetic acid. Bases that may be used include hydroxides such as sodium hydroxide, ammonium hydroxide, and potassium hydroxide. Solvents may be polar, such as water, or non-polar, such as xylene or cellusolve, or of intermediate polarity, such as alcohols such as methanol or ethanol. For process 100, the etching method is selected to avoid substantially removing the exposed portion of the copper seed layer.

In one embodiment, trimming increases a line width by at least about 10%. In another embodiment, trimming increases a line width by at least about 25%. In a further embodiment, trimming increases a line width by at least about 50%.

Figure 3:
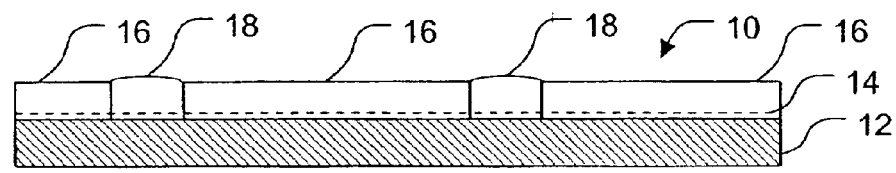
FIG. 3 illustrates the structure of FIG. 2 after plating with copper.

Act 108 is plating with copper. Plating can involve electroless or electroplating. Electroless plating involves controlled autocatalytic deposition by the interaction of the seed layer or deposited copper with a metal salt and a chemical reducing agent that are in solution. Electroplating involves reduction of metal ions in a plating solution by supplying electrons from an external source to an electrode that includes the seed layer and copper deposited thereon. In either case, copper features 18 grow from the exposed portion of the copper seed layer to provide a structure such as illustrated in FIG. 3.

Plating, and other actions aside from trimming that take place prior to stripping the resist, are carried out with appropriate consideration for the chemical and physical stability of the resist. For example, the resist is generally not exposed to temperatures in excess of about 250° C. Preferably, the resist is not exposed to temperatures in excess of about 200° C. Electroless plating can affect resists that are low in chemical stability, therefore, a relatively chemically inert resist is desirable during electroless plating. Optionally, the chemical stability of the resist is increased by cross-linking prior to electroless plating. Cross-linking can be increased in many positive tone photoresists by extended exposure to actinic radiation.

Figure 4:
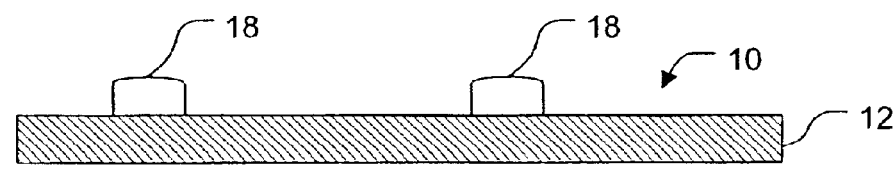
FIG. 4 illustrates the structure of FIG. 3 after stripping the resist.

Act 110 is stripping the resist. Any suitable stripping agent can be employed. The resulting structure, in which copper features 18 are exposed, is illustrated by FIG. 4. Optionally, a polishing step can be employed prior to stripping the resist. Polishing can planarize the copper features and the resist and thereby remove any copper that grows outside of openings in the patterned resist.

After stripping the resist, the copper features are optionally coated with a diffusion barrier material. A diffusion barrier can be desirable to prevent copper from diffusing into a dielectric subsequently formed adjacent the copper. Suitable diffusion barrier materials include tantalum (Ta), tantalum nitride (TaN), titanium (Ti), titanium tungsten (TiW), and silicon nitride ($Si_3N_4$). The copper features can be coated with the diffusion barrier material by any suitable method, CVD, for example.

Figure 5:
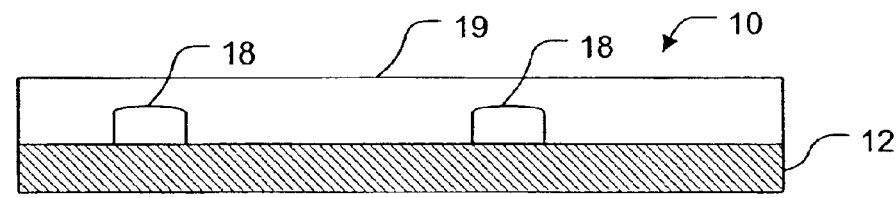
FIG. 5 illustrates the structure of FIG. 4 after coating with a dielectric.

Act 112 is coating the semiconductor substrate and copper features with a dielectric. FIG. 5 illustrates the resulting structure, in which the dielectric 19 covers the copper feature 18. Examples of dielectrics include silicon nitride, tetraethyl orthosilicate (TEOS), BPTEOS, flouronated silicate glass (FSG), borophosphosilicate glass (BPSG), PSG, silicon dioxide, and silicon oxynitride. The dielectric may be coated by any suitable process. Depending on the dielectric, suitable processes include CVD, plasma enhance CVD, and spin coating.

Figure 6:
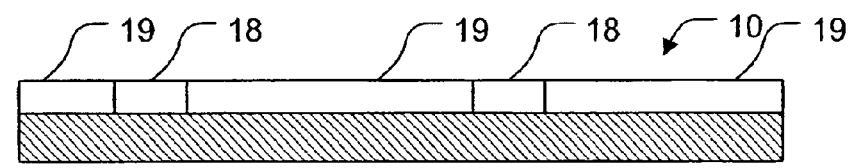
FIG. 6 illustrates the structure of FIG. 5 after removing a portion of the dielectric.

Act 114 is polishing. As illustrated in FIG. 6, polishing removes a portion of the dielectric 19, exposes the copper features 18, and planarizes the surface. To the extent that copper features 18 grew over and outside the resist pattern in act 108, polishing removes the excess copper to limit the copper features to the pattern defined by the resist. After polishing, the dielectric occupies only the spaces between copper features.

Polishing can be purely mechanical or chemical mechanical. Mechanical polishing involves contact the surface with a polishing pad. Chemical mechanical polishing uses a material, often referred to as a slurry, that does not rapidly dissolve the material being removed, but modifies its chemical bonding sufficiently to facilitate mechanical removal with a polishing pad.

Figure 7:
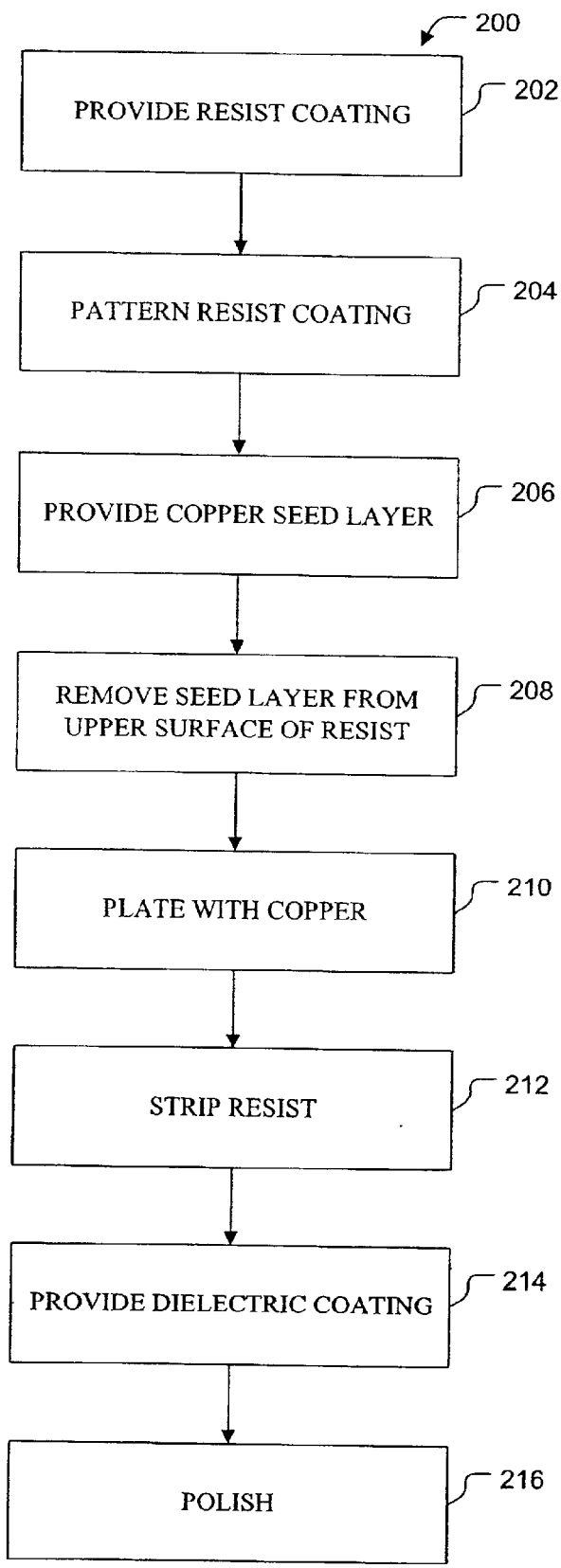
FIG. 7 is a flow chart of a process for forming copper features according to another aspect of the present invention.
Figure 8:
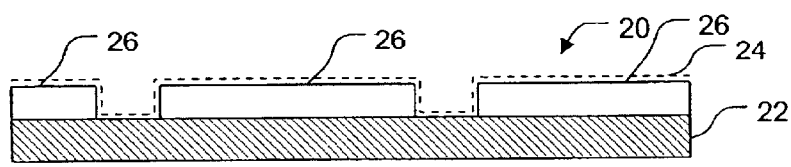
FIG. 8 illustrates a copper seed layer over a patterned resist over a semiconductor substrate.

FIG. 7 illustrates a process 200 according to another aspect of the present invention. Process 200 begins with act 202, which is providing a resist coating, and act 204, which is patterning the resist. These acts are similar to acts 104 and 106 of process 100, except there is no copper seed layer on the semiconductor substrate. The patterned resist can be trimmed as in process 100, however, because there is no copper seed layer, additional options for trimming are available Act 206 is forming a copper seed layer. The seed layer can be formed by a process such as described for act 102 of process 100. However, the seed layer is formed over the patterned resist, giving a structure such as illustrated by device 20 in FIG. 8. Device 20 include semiconductor substrate 22, patterned resist 26, and copper seed layer 24.

Figure 9:
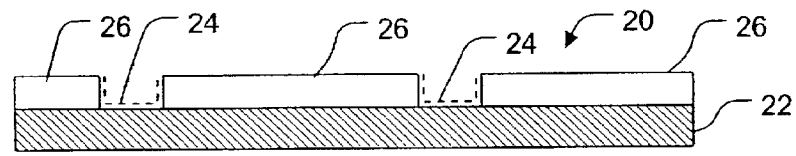
FIG. 9 illustrates the structure of FIG. 8 after removing a portion of the copper seed layer.

Act 208 is removing the copper seed layer from the upper surface of the resist to provide a structure such as illustrated in FIG. 9. The copper seed layer can be removed from this surface by any suitable means that leaves the copper seed layer within the pattern gaps. For example, a reactive ion etching process can be employed with ions incident at an angle that is sharply oblique with respect to the surface. A polishing process, such as mechanical or chemical mechanical polishing, can also be employed.

Figure 10:
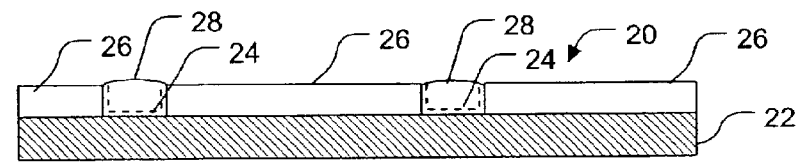
FIG. 10 illustrates the structure of FIG. 9 after plating with copper.
Figure 11:
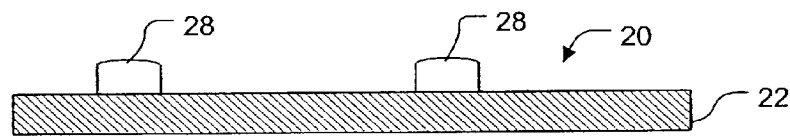
FIG. 11 illustrates the structure of FIG. 10 after stripping the resist.
Figure 12:
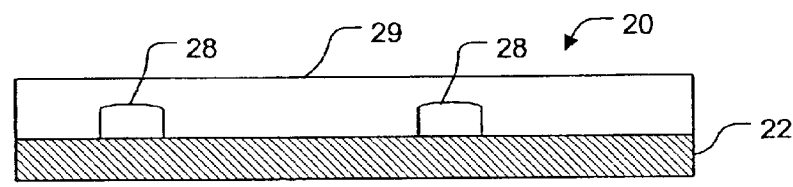
FIG. 12 illustrates the structure of FIG. 11 after coating with a dielectric.
Figure 13:
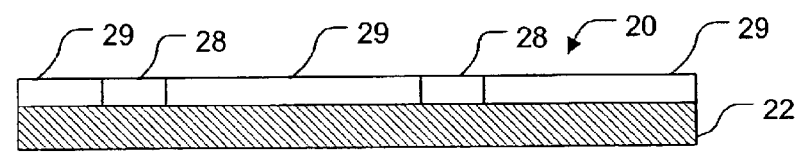
FIG. 13 illustrates the structure of FIG. 12 after removing a portion of the dielectric.

The remaining acts in process 200 are similar to corresponding acts in process 100. Act 210 is plating with copper, which is similar to act 108 of process 100. Plating with copper produces a structure such as illustrated in FIG. 10, wherein copper features 28 fill gaps in patterned resist 26. Act 212 is stripping the resist, which is similar to act 110 of process 100. Stripping the resist produces a structure such as illustrated in FIG. 11. Act 214 is coating with a dielectric, which is similar to act 112 of process 100. Coating with a dielectric produces a structure such as illustrated in FIG. 12, wherein dielectric 29 covers copper features 28. Act 216 is polishing, which is similar to act 114 of process 100. Polishing produces a structure such as illustrated in FIG. 13.

Figure 14:
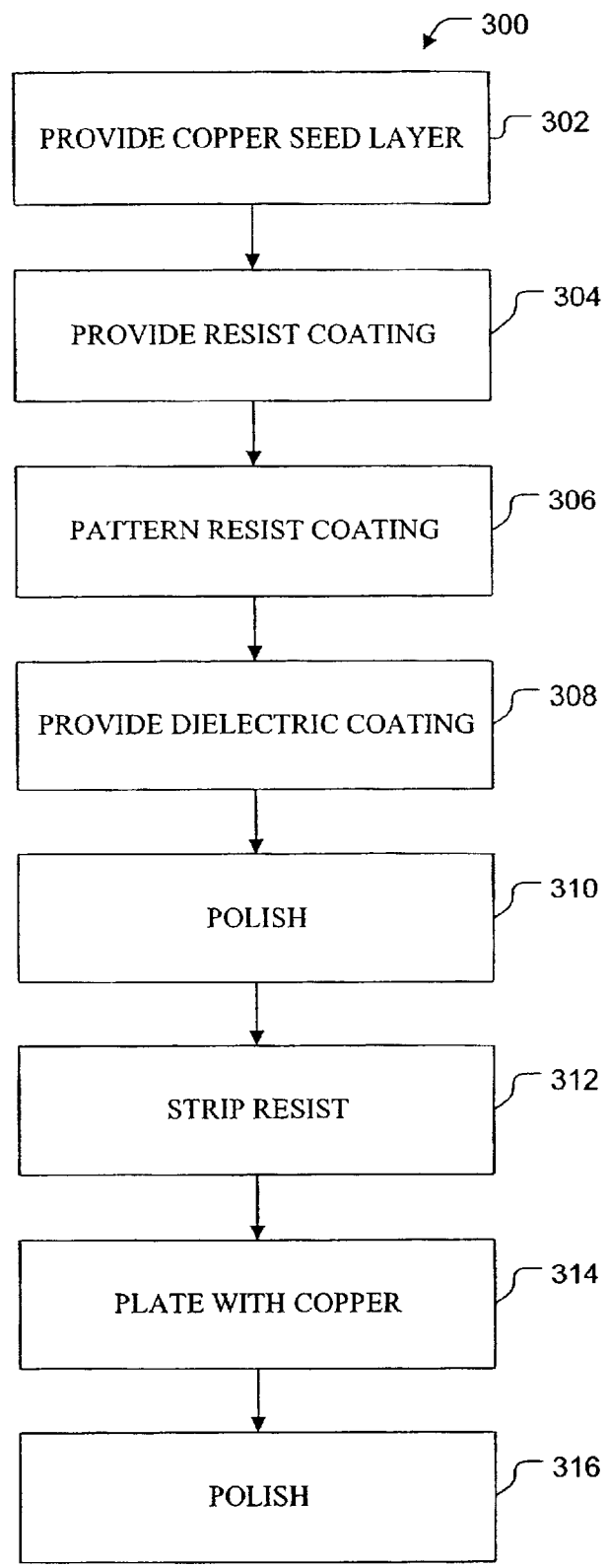
FIG. 14 is a flow chart of a process for forming copper features according to a further aspect of the present invention.
Figure 15:
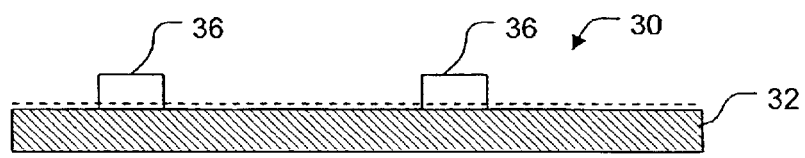
FIG. 15 illustrates a patterned resist over a copper seed layer over a semiconductor substrate.

FIG. 14 illustrate a process 300 according to a further aspect of the present invention. Process 300 begins with acts 302, 304, and 306, which are providing a copper seed layer, providing a resist coating, and patterning the coating. These are similar to acts 202 and 204 of process 206, except that the pattern of the resist coating is the inverse of the pattern that would be used in process 100. The result is a device with a structure such as illustrated by device 30 in FIG. 15. Device 30 includes substrate 32, copper seed layer 34, and resist 36.

Figure 16:
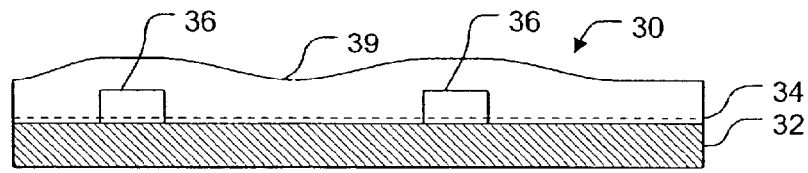
FIG. 16 illustrates the structure of FIG. 15 after coating with a dielectric.

Act 308 is coating the resist with a dielectric. This is similar to act 112 of process 100, except that the dielectric is being coated over the patterned resist coating, whereby the patterned gaps are filled with dielectric resulting in a structure such as illustrated in FIG. 16, wherein dielectric 39 covers patterned resist 36.

Figure 17:
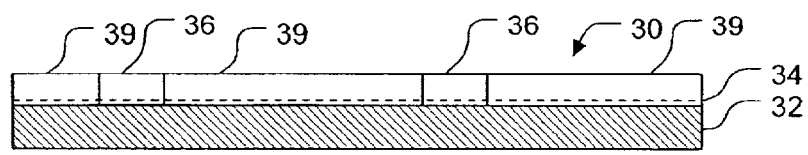
FIG. 17 illustrates the structure of FIG. 16 after polishing.

Act 310 is polishing. Polishing is similar to act 114 of process 100 and removes the dielectric outsider the pattern gaps. This results in a structure such as illustrated in FIG. 17, wherein the dielectric 39 forms a patterned layer that is planar with the resist 36. The patterns of dielectric 39 is the inverse of the resist pattern provided in act 306.

Figure 18:
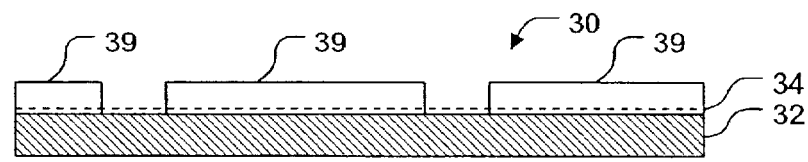
FIG. 18 illustrates the structure of FIG. 17 after stripping the resist.

Act 312 is stripping the resist and is similar to act 110 of process 100 and results in a structure such as illustrated in FIG. 18. Stripping leaves the patterned dielectric layer and exposes the copper seed layer. Optionally act 302 can be omitted and a copper seed layer formed at this stage in the gaps in the dielectric coating in a manner similar to process 200.

Figure 19:
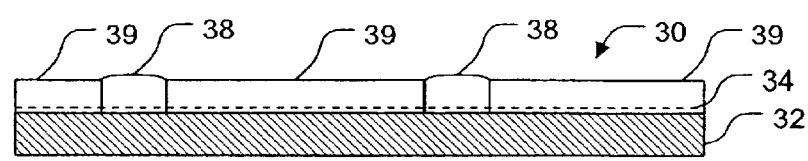
FIG. 19 illustrates the structure of FIG. 18 after plating with copper.

Act 314 is plating with copper, which is similar to act 108 of process 100 and results in the structure illustrated in FIG. 19. FIG. 19 show copper features 38 filling gaps in dielectric layer 39. Optionally, the dielectric coating is trimmed prior to plating with copper. The dielectric can be trimmed with similar effects and by similar methods as described for trimming the resist coating in process 100.

Figure 20:
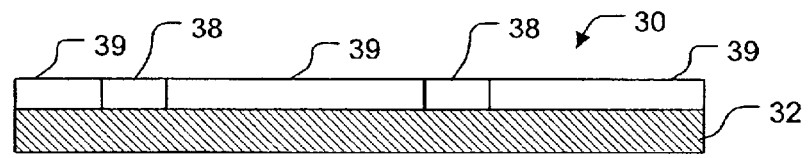
FIG. 20 illustrates the structure of FIG. 19 after polishing.

Generally, act 316 follows, which is polishing. Polishing planarizes the copper features and the dielectric layer and results in a structure such as illustrated in FIG. 20. Polishing is similar to act 114 of process 100. In some cases, polishing at this stage can be omitted.

Another embodiment of the invention is similar to process 300 except that a coating other than a temporary coating is applied in act 304. The temporary coating is removed after the copper features are grown. Once the temporary coating is removed, the structure can proceed as in process 100, with steps such as providing a dielectric coating and polishing. The temporary coating is thereby replaced with a permanent dielectric coating. One advantage of the process with the temporary coating is that it provides an opportunity to coat the copper features with a diffusion barrier layer. Another advantage is that the temporary coating can be designed to lend itself to trimming.

The temporary coating can be virtually any coating that can be removed with a solvent but preserved while the resist is stripped. For example, it can be a resist of a different type. The temporary coating material may be a positive tone resist, a negative tone resist, or a material that is not a resist (such as an oxide or nitride). The temporary coating material may be polymeric, glassy, or crystalline. The temporary coating material may be organic or inorganic. The temporary coating may be applied by any suitable means, including chemical vapor deposition, spin coating, and dip coating.

When the temporary coating material is applied to the substrate as a solution that is later cured, the solution is usually selected so that it does not substantially dissolve the patterned resist. Preferably, the solvent system for the temporary coating has little or no effect on the patterned resist. For example, where the patterned resist includes novolac or exposed PBOCOS, aqueous alkali solvent systems are generally avoided. Where the patterned resist is PMMA, POS, or unexposed PBOCOS, organic solvent systems are generally avoided. Exposure of PBOCOS to actinic radiation changes its solubility from solubility in non-polar organic solvents to solubility in aqueous alkali.

The temporary coating contains a material that has, or can develop, a different solubility from the patterned resist coating. A difference in solubility may be developed, for example, by exposing a patterned resist containing a positive tone photoresist to actinic radiation after application of the temporary coating.

In view of the forgoing, an appropriate choice for the temporary coating material may depend in part on the identity of the patterned resist coating. Novolac and exposed PBOCOS patterned resist coatings allow a wide range of choices for the temporary coating material. Choices include polysiloxanes, fluoropolymers, polystyrene, PMMA, novalac, PBOCOS, PMIPK, and poly(olefin sulfones), to name a few. Negative tone resists can be used without concern for swelling problems.

Patterned resist coatings based on PMMA or POS also place few limitations on the identity of the temporary coating material. Choices for the temporary coating include polysiloxanes, fluoropolymers, polystyrenes, PBOCOS, and novalacs. PMMA and POS are easily etched.

Although the invention has been shown and described with respect to a certain preferred embodiment or embodiments, it is obvious that equivalent alterations and modifications will occur to those of ordinary skill in the art upon reading and understanding this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application

What is claimed is:

1. A method of forming copper features on a semiconductor substrate, comprising:

coating the substrate with a copper seed layer to form a composite;

coating the composite with a resist;

exposing the resist to actinic radiation;

developing the resist to expose a portion of the copper seed layer and form a patterned resist coating; and plating copper to obtain copper features grown from the copper seed layer.

2. The method of claim 1, further comprising:

stripping the resist after plating the copper;

forming a dielectric coating over the copper features; and removing a portion of the dielectric coating to expose the copper features.

3. The method of claim 2, wherein the portion of the dielectric coating is removed by mechanical polishing.

4. The method of claim 2, wherein the portion of the dielectric coating is removed by chemical-mechanical polishing.

5. The method of claim 2, further comprising, prior to coating with the dielectric, coating the copper features with a diffusion barrier forming material.

6. The method of claim 2, further comprising, prior to stripping the resist, planarizing the copper features and the patterned resist coating.

7. The method of claim 1, further comprising after developing but prior to plating, trimming the patterned resist coating to increase a line width defined by an opening in the patterned resist coating.

8. The method of claim 7, wherein trimming increases the line width by at least about 25%.

9. A method of forming copper features on a semiconductor substrate, comprising:

coating the semiconductor substrate with a resist;

exposing the resist to actinic radiation;

developing the resist to form a patterned resist coating having openings;

forming a copper seed layer over the patterned resist coating and substrate to form a composite;

removing a portion of the copper seed layer outside of the openings;

plating copper to obtain copper features grown from the copper seed layer within the openings of the patterned resist coating.

10. The method of claim 9, further comprising:

stripping the resist;

coating the copper and the exposed substrate with a dielectric; and removing a portion of the dielectric to expose the copper.

11. The method of claim 10, further comprising, prior to coating with the dielectric, coating the copper with a diffusion barrier forming material.

12. The method of claim 10, further comprising, prior to stripping the resist, planarizing the copper features and the resist.

13. The method of claim 9, further comprising after developing but prior to plating, trimming the patterned resist coating to increase a line width defined by an opening in the patterned resist coating.

14. The method of claim 13, wherein trimming increases the line width by at least about 25%.

15. A method of forming copper features on a semiconductor substrate, comprising:

coating the substrate with a copper seed layer to form a composite;

coating the composite with a resist;

exposing the resist to actinic radiation;

developing the resist to form a patterned resist coating having openings; and coating the resist with a dielectric that fills the openings;

polishing to remove dielectric outside the openings;

stripping the resist to expose a portion of the copper seed layer; and plating copper to obtain copper features grown from the copper seed layer.

16. The method of claim 15, further comprising planarizing the copper features and the dielectric.

17. The method of claim 15, further comprising trimming the dielectric prior to plating to increase a line width defined by an opening in the patterned resist coating.

18. The method of claim 17, trimming increases the line width by at least about 25%.

19. A method of forming copper features on a semiconductor substrate, comprising:

coating the substrate with a copper seed layer to form a composite;

coating the composite with a resist;

exposing the resist to actinic radiation;

developing the resist to form a patterned resist coating having openings; and coating the patterned resist with a temporary coating that fills the openings in the patterned resist;

polishing to remove the temporary coating outside the openings in the patterned resist;

stripping the resist to expose a portion of the copper seed layer; and plating copper to obtain copper features grown from the copper seed layer;

stripping the temporary coating; coating the copper features with a dielectric; and polishing to expose the copper features.

20. The method of claim 19, further comprising trimming the temporary coating prior to plating to increase a line width defined by an opening in the temporary coating.

21. The method of claim 17, wherein trimming increases the line width by at least about 25%.

22. The method of claim 19, further comprising, prior to coating with the dielectric, coating the copper features with a diffusion barrier forming material.

23. A method of forming copper features on a semiconductor substrate, comprising:

coating the substrate with a copper seed layer having a thickness of less than about 100 Å to form a composite;

coating the composite with a resist having a thickness from about 100 Å to about 20,000 Å;

exposing the resist to actinic radiation;

developing the resist to expose a portion of the copper seed layer and form a patterned resist coating; and plating copper to obtain copper features grown from the copper seed layer.

24. A method of forming copper features on a semiconductor substrate, comprising:

coating the substrate with a copper seed layer having a thickness of less than about 100 Å to form a composite;

coating the composite with a resist;

exposing the resist to actinic radiation;

developing the resist to expose a portion of the copper seed layer and form a patterned resist coating; and plating copper to obtain copper features grown from the copper seed layer.

25. The method of claim 24, herein the resist has a thickness from about 500 Å to about 10,000 Å.

* * * * *